United States Patent [19]

Ehlers

[11] Patent Number: 5,666,089

[45] Date of Patent: Sep. 9, 1997

[54] MONOLITHIC STEP ATTENUATOR HAVING INTERNAL FREQUENCY COMPENSATION

[75] Inventor: Eric R. Ehlers, Santa Rosa, Calif.

[73] Assignee: Hewlett-Packard Company, Palo Alto, Calif.

[21] Appl. No.: 631,522

[22] Filed: Apr. 12, 1996

[51] Int. Cl.⁶ .................................................. H03H 7/24
[52] U.S. Cl. ............................... 333/81 R; 327/308
[58] Field of Search .......................... 333/81 R, 81 A; 323/349–351, 353, 354; 327/308

[56] References Cited

U.S. PATENT DOCUMENTS 5,563,557  10/1996  Sasaki ........................ 333/81 R

FOREIGN PATENT DOCUMENTS

360916  4/1990  European Pat. Off. ............. 333/81 R

*Primary Examiner*—Paul Gensler
*Attorney, Agent, or Firm*—John L. Imperato

[57] ABSTRACT

In the present invention a monolithic step attenuator has internal frequency compensation provided by a field effect transistor, or FET, fabricated to have a well defined drain-to-source capacitance. The drain-to-source capacitance of the FET cancels the effect of parasitic impedances, providing a constant frequency response for the monolithic step attenuator within a defined frequency range. In a first embodiment of the present invention, internal frequency compensation is provided by a FET connected in a shunt arm of a Tee resistor network forming the monolithic step attenuator. In a second embodiment of the present invention, internal frequency compensation is provided by a pair of FETs, each FET connected in one of two shunt arms of a Pi resistor network forming the monolithic step attenuator. In a third embodiment of the present invention, a multicell step attenuator is formed by connecting multiple monolithic step attenuators having internal frequency compensation in series.

13 Claims, 7 Drawing Sheets

MONOLITHIC STEP ATTENUATOR HAVING INTERNAL FREQUENCY COMPENSATION

FIELD OF THE INVENTION

The present invention relates to signal attenuators in the microwave frequency range and, more particularly, to a monolithic step attenuator having internal frequency compensation to reduce the effects of parasitic circuit impedances on the attenuator's frequency response.

BACKGROUND OF THE INVENTION

Solid state step attenuators are used to control the amplitude of high frequency electrical signals in a variety of microwave systems because of their high reliability and low cost. When incorporated into an instrument such as a signal source, a solid state step attenuator provides amplitude control at the signal source's output. The solid state step attenuator has a low attenuation state and a high attenuation state, enabled by control signals. In the low attenuation state, electrical signals applied to the attenuator propagate through the attenuator relatively unimpeded, while in the high attenuation state, electrical signals applied to the attenuator are reduced in amplitude by a preset attenuation value. Solid state step attenuators have low manufacturing cost because they are fabricated monolithically, tested in wafer form and packaged inexpensively.

Unfortunately, solid state switches and other circuit elements used in the solid state step attenuator have inherent parasitic impedances, causing a variation in the attenuator's frequency response. Compensation for the variation in the frequency response may be achieved external to the attenuator by adjusting the amplitude of the applied electrical signal according to the signal frequency. However, external frequency compensation increases the cost and complexity of the microwave system in which the solid state step attenuator is used.

SUMMARY OF THE INVENTION

In the present invention, a monolithic step attenuator having internal frequency compensation eliminates the need for external frequency compensation, reducing the cost and complexity of microwave systems. Internal frequency compensation is provided by a field effect transistor, or FET, fabricated to have a well defined drain-to-source capacitance. The drain-to-source capacitance of the FET cancels the effect of parasitic impedances, providing a constant frequency response for the monolithic step attenuator within a defined frequency range. In accordance with a first embodiment of the present invention, internal frequency compensation is provided by a FET connected in a shunt arm of a Tee resistor network forming the monolithic step attenuator. In accordance with a second embodiment of the present invention, internal frequency compensation is provided by a pair of FETs, each FET connected in one of two shunt arms of a Pi resistor network forming the monolithic step attenuator. In accordance with a third embodiment of the present invention, a multicell step attenuator is formed by connecting multiple monolithic step attenuators having internal frequency compensation in series.

DETAILED DESCRIPTION OF THE PREFERRED EMBODIMENT

The amplitude of high frequency electrical signals within microwave systems is controlled using various types of signal attenuators. Fixed attenuators, which have a fixed attenuation value, are commonly implemented using Pi or Tee resistor networks. When these fixed attenuators are placed in an electrical signal path, the signal at the attenuator's output, relative to the signal at the attenuator's input, is attenuated, or reduced in amplitude by a fixed amount which is dependent upon the resistor values in the resistor network.

Step attenuators, which have a switchable attenuation value, are also implemented using Pi or Tee resistor networks, but also incorporate solid state switches to electronically switch resistors in and out of the resistor networks. The switches, opened and closed by control signals, change or "step" the attenuation value of the step attenuator between a low attenuation state and a high attenuation state. Solid state step attenuators integrate solid state switches and resistor networks on a single integrated circuit (IC). Solid state step attenuators have high reliability, in contrast to mechanical step attenuators which employ mechanical switches having moving mechanical parts to switch attenuation states.

Figure 1A:
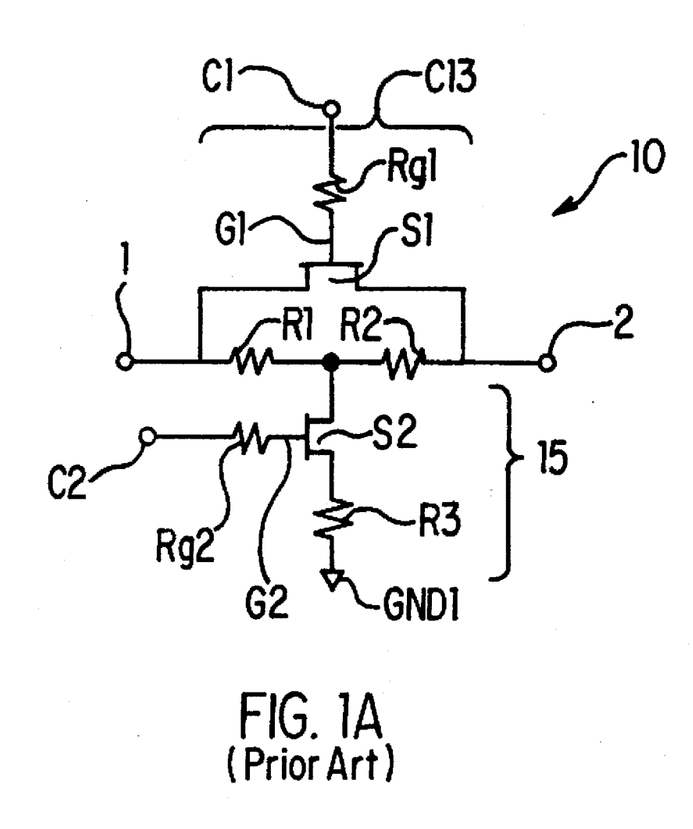
FIGS. 1A, 1B, and 1C show a prior art solid state step attenuator.

FIG. 1A shows a known solid state step attenuator 10. Typically, the solid state step attenuator 10 is fabricated on a Gallium-Arsenide (GaAs) IC using integrated resistors to form a Tee resistor network and Field Effect Transistors (FETs) to form the switches. Series resistors R1 and R2 form the series arm 13 of the Tee resistor network. Shunt resistor R3 forms the shunt arm 15 of the Tee resistor network. A FET switch S1 in the series arm 13 is controlled by a control line C1 which supplies a voltage to a gate G1 of FET switch S1 through a gate resistor Rg1. A FET switch S2 in the shunt arm 15 is controlled by a control line C2 which supplies a voltage to a gate G2 of FET switch S2 through gate resistor Rg2.

Figure 1B:
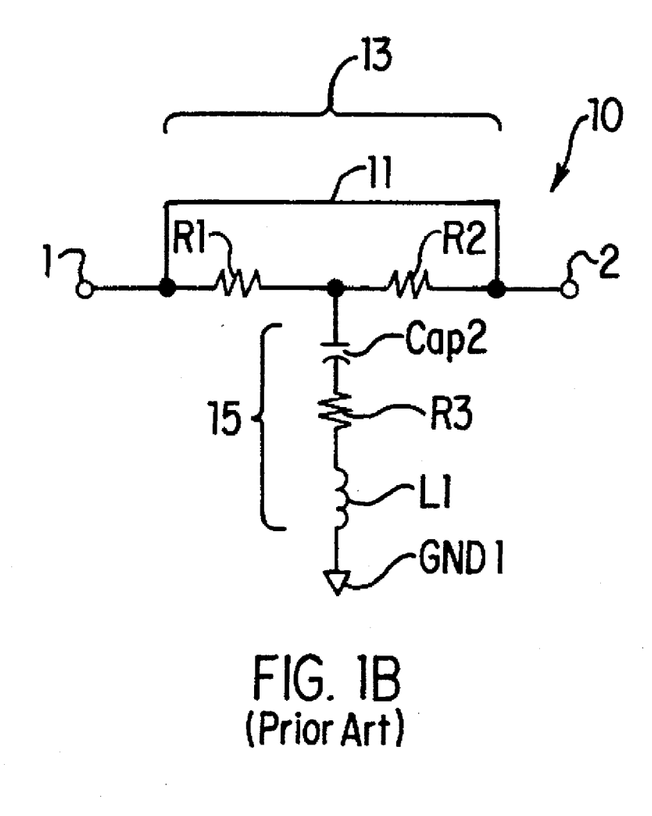

FIG. 1B shows the equivalent circuit for the solid state step attenuator 10 in its low attenuation state. When a positive voltage is applied to control line C1, FET switch S1 closes and there is a low resistance between the drain and source of the FET switch S1. The low resistance is modeled by a short circuit 11 between the input 1 and output 2 of the attenuator 10. When a negative voltage is applied to control line C2, FET switch S2 opens and there is a high impedance between the drain and source of the FET switch S2, that is modeled by a capacitance Cap2. Thus, with control line C1 positive and control line C2 negative, there is a low impedance in the series arm 13 of the Tee resistor network and a high impedance in the shunt arm 15, providing minimum attenuation to electrical signals between the input 1 and output 2 of the attenuator 10.

Figure 1C:
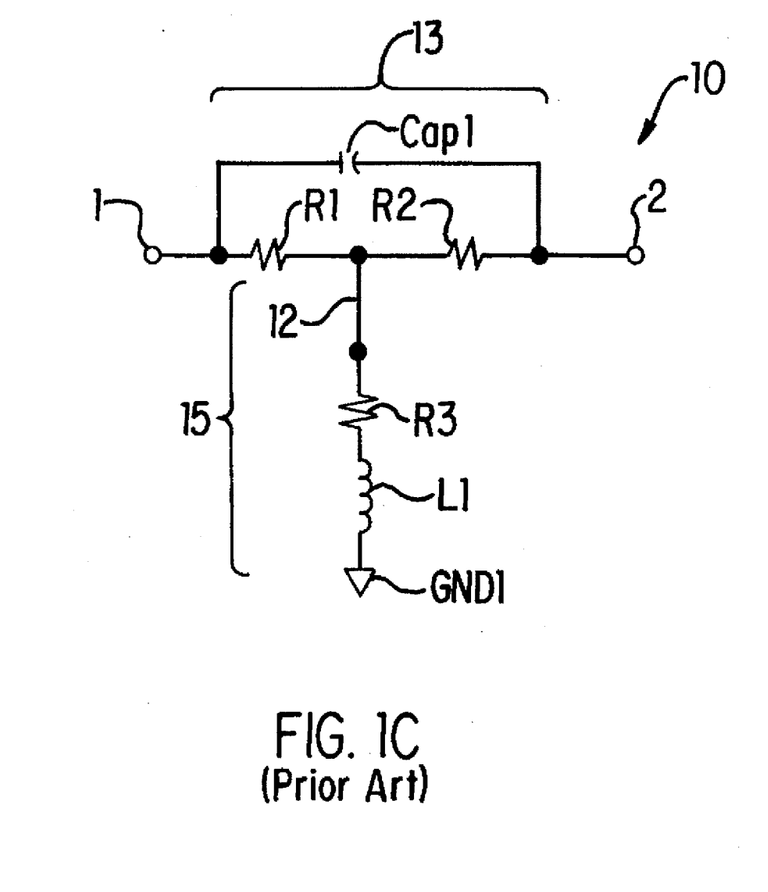

FIG. 1C shows the equivalent circuit for the solid state step attenuator 10 in its high attenuation state. When a negative voltage is applied to control line C1, FET switch S1 opens and there is a high impedance between the drain and source of the FET switch S1, modeled by a capacitor Cap1, between the input 1 and output 2 of the attenuator 10. When a positive voltage is applied to control line C2, FET switch S2 closes and there is a low impedance between the drain and source of the FET switch S2, modeled by a short circuit 12 between the series resistors R1 and R2 and the shunt resistor R3. Thus, with control line C1 negative and control line C2 positive, there is a high impedance in the series arm 13 of the Tee resistor network and a low impedance in the shunt arm 15, providing attenuation to electrical signals between the input 1 and output 2. The value of this attenuation is determined by the series resistors R1 and R2, and the shunt resistor R3. The attenuation value is often specified in decibels (dB) where one dB equals 20 times the logarithm of the ratio of the signal amplitude at the input 1 to the signal amplitude at the output 2.

The attenuator 10 is designed to have an attenuation step defined by the difference in the attenuation value, in dB, between its high (maximum) attenuation state and its low (minimum) attenuation state. In order to achieve a uniform signal amplitude within a defined frequency range in a microwave system, without impacting system cost or complexity, it is desirable that the attenuation step versus frequency, or the frequency response, of the attenuator 10 be constant and independent of the frequency of the signal applied to the attenuator, within the frequency range. If the frequency response is not flat or constant, frequency compensation external to the attenuator 10 is often applied, increasing the cost and complexity of microwave systems in which the attenuator 10 is used. For example, the HP8360 synthesized microwave signal source, commercially available from the Hewlett-Packard Company, uses a calibration algorithm to generate a frequency dependent correction table used to compensate for variations in the amplitude of the signal at the instrument's output caused, in part, by the non-flat frequency response of the instrument's attenuator.

Figure 3:
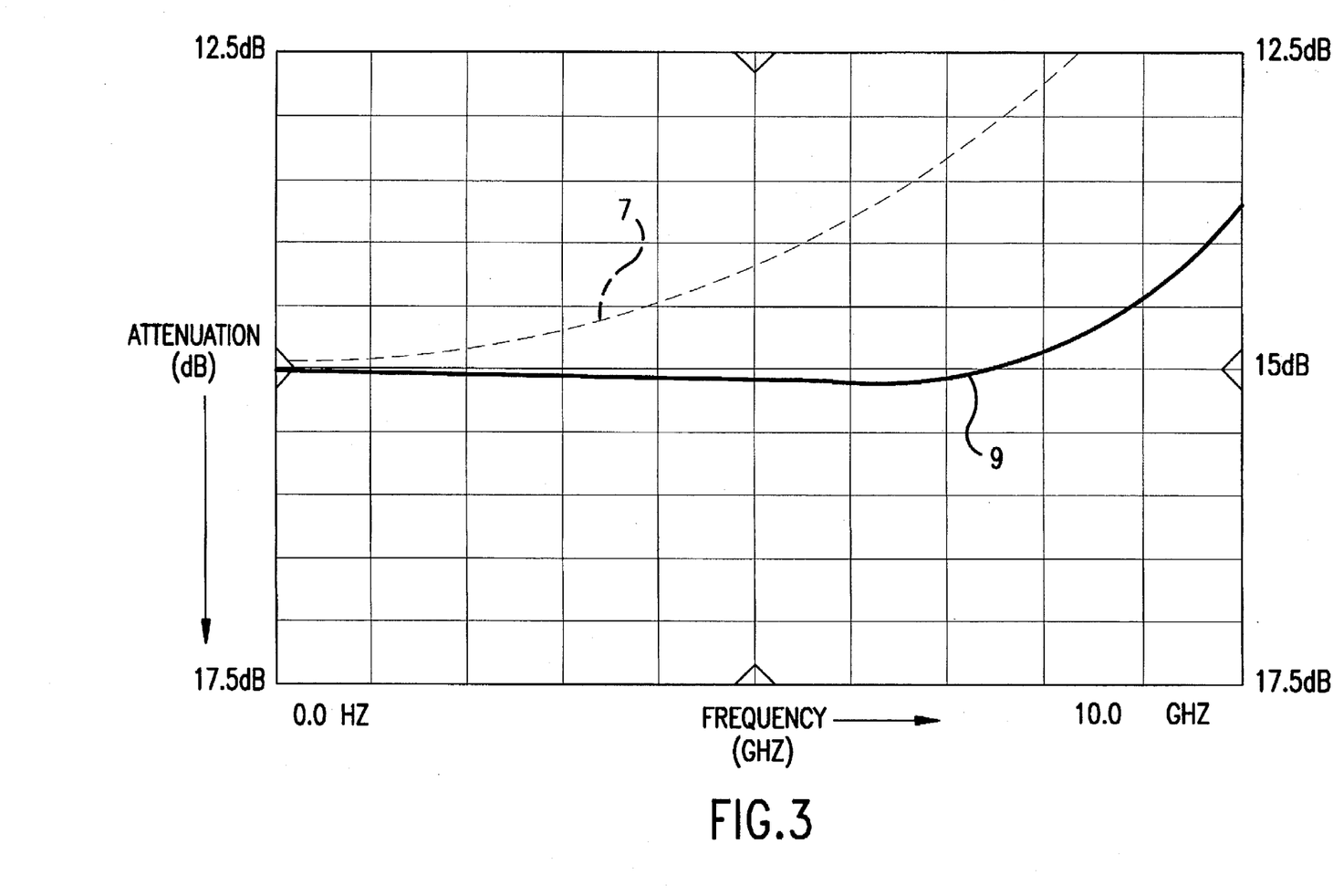
FIG. 3 shows both the frequency response of the solid state step attenuator of FIGS. 1A, 1B, and 1C and the monolithic step attenuator of FIGS. 2A, 2B, and 2C.

Unfortunately, due to the effects of parasitic impedances in the attenuator 10, the frequency response 7 is not constant, and the attenuation value in the high attenuation state varies with frequency, as shown in FIG. 3. Typically, the attenuation value in the high attenuation state decreases as the frequency of the signal applied to the attenuator 10 increases, producing an upward slope in the frequency response 7 of the known solid state step attenuator 10. This upward slope in the frequency response is attributed to two parasitic impedances shown in FIG. 1C—parasitic inductance L1 and parasitic capacitance Cap1. Parasitic capacitance Cap1 is due to the drain-to-source capacitance of FET switch S1. As the frequency of the signal applied to the input 1 increases, current in capacitance Cap1 increases, lowering the impedance provided by series resistors R1 and R2 in the series arm 13 of the Tee network, located between the input 1 and output 2. Parasitic inductance L1 is due to the inherent inductance of the conductive path between shunt resistor R3 and ground plane GND1 of the GaAs IC. As frequency of the signal applied to the input 1 increases, the impedance in the shunt arm 15 of the Tee resistor network increases due to inductance L1. This decrease in the impedance in the series arm 13 combined with the increase in the impedance in the shunt arm 15 create an upward slope in the frequency response 7 of the solid state step attenuator 10, shown in FIG. 3.

The effect of the slope in the frequency response is worsened in microwave systems in which multiple attenuators 10 are cascaded in series to form step attenuators having multiple attenuation steps. The slopes of each attenuator 10 in the cascade are additive (in dB) to form an overall slope equal to the sum of the individual slopes. For example, when two attenuators 10, each having a ten dB attenuation step are cascaded, a step attenuator having 0 dB, 10 dB and 20 dB attenuation steps is formed. If each attenuator 10 has a slope of 1 dB in the frequency range between 1 and 5 GHz, the overall frequency slope of the cascaded pair is the sum of the slopes, or 2 dB, in the frequency range between 1 and 5 GHz.

Figures 2A, 2B, 2C:
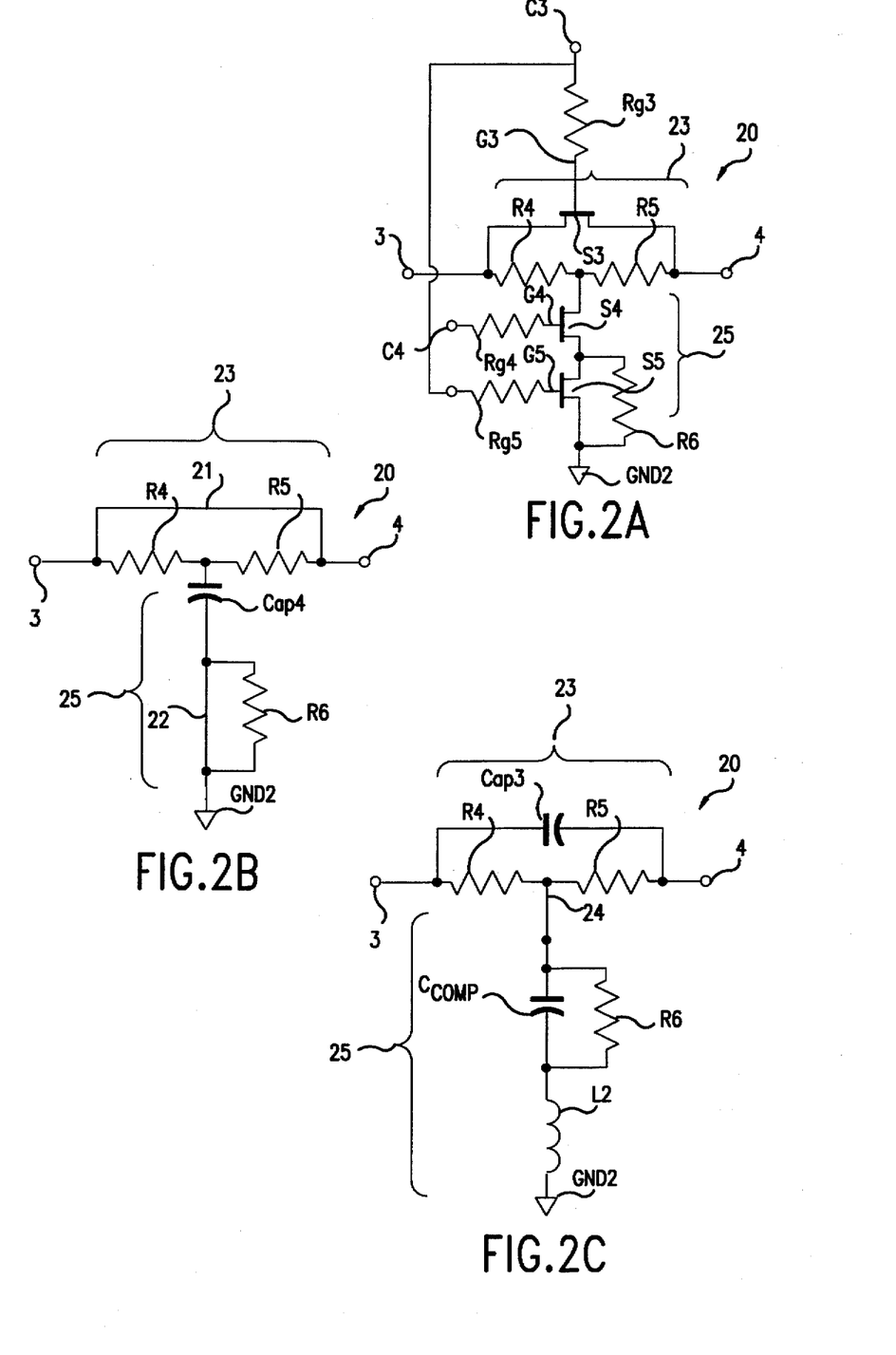
FIGS. 2A, 2B, and 2C show a monolithic step attenuator that is constructed in accordance with a first embodiment of the present invention.

FIG. 2A shows a monolithic step attenuator 20 having internal frequency compensation, that is constructed in accordance with a first preferred embodiment of the present invention. The internal frequency compensation is provided by a FET switch S5 and produces a flat frequency response over a defined frequency range. The monolithic step attenuator 20, fabricated as a GaAs IC, includes a Tee resistor network including series resistors R4 and R5 forming a series arm 23 and shunt resistor R6 forming a shunt arm 25 of the Tee resistor network. FET switch S3 is connected across series resistors R4 and R5 between an input 3 and an output 4, while FET switch S4 is connected in series with shunt resistor R6. FET switch S5 is connected in shunt, across shunt resistor R6. FET switches S3 and S5 are controlled by control line C3 that supplies a voltage to gates G3 and G5 through gate resistors Rg3 and Rg5, respectively. FET switch S4 is controlled by control line C4, which supplies a voltage to gate G4 through gate resistor Rg4.

FIG. 2B shows the equivalent circuit for the monolithic step attenuator 20 in its low attenuation state. When a positive voltage is applied to control line C3, FET switch S3 is turned on and there is a low resistance between the drain and source of the FET switch S3, modeled by a short circuit 21 between the input 3 and output 4 of the monolithic step attenuator 20. FET switch S5 is also closed by the positive voltage applied to control line C3, providing a low impedance between the drain and source of FET switch S5. This low impedance is also modeled as a short circuit 22, shunted across shunt resistor R6. When a negative voltage is applied to control line C4, FET switch S4 opens and there is a high impedance between the drain and source of the FET switch S4, modeled by capacitance Cap4. Thus, with control line C3 positive and control line C4 negative, there is a low impedance in the series arm 23 of the Tee resistor network and a high impedance in the shunt arm 25, providing minimum attenuation to electrical signals between the input 3 and output 4. The effect of FET switch S5 in the low attenuation state is minimized because the impedance in the shunt arm 25 of the Tee resistor network is dominated by the high impedance provided by capacitance Cap4.

The gate resistor Rg5 is shown connected to control line C3 in order to reduce the number of control lines to the monolithic step attenuator 20. Alternatively, the voltage supplied to the gate G5 of FET switch S5 is controlled independently via a control line (not shown) that is separate from control line C3. Internal frequency compensation is provided as long as the FET switch S5 is open in the monolithic step attenuator's 20 high attenuation state, regardless of whether the FET switch S5 is open or closed in the low attenuation state.

FIG. 2C shows the equivalent circuit for the monolithic step attenuator 20 in its high attenuation state. When a positive voltage is applied to control line C4, FET switch S4 closes and there is a low impedance between the drain and source of the FET switch S4, modeled by a short circuit 24 between the series resistors R4 and R5 and to the shunt resistor R6. When a negative voltage is applied to control line C3, FET switch S3 opens and there is a high impedance between the drain and source of the FET switch S3 that is modeled by a capacitor Cap3 between the input 3 and output 4. Capacitor Cap3 represents the parasitic drain-to-source capacitance of FET switch S3. The negative voltage applied to control line C3 also causes FET switch S5 to open. This provides a high impedance between the drain and source of FET switch S5, modeled by capacitance $C_{comp}$, connected in shunt, across shunt resistor R6. Thus, with control line C3 negative and control line C4 positive, there is attenuation to electrical signals between the input 3 and output 4. The attenuation value is determined by series resistors R4 and R5, and shunt resistor R6.

The capacitance $C_{comp}$ is chosen to produce a constant frequency response for the monolithic step attenuator in its high attenuation state. The capacitance $C_{comp}$ lowers the impedance of the shunt arm 25 of the Tee resistor network frequency of the electrical signal applied to the monolithic step attenuator 20 increases. This counteracts the increase in the impedance in the shunt arm 25 due to a parasitic inductance L2 inherent in the conductive path between shunt resistor R6 and a ground plane GND2 of the GaAs IC. The capacitance $C_{comp}$ also counteracts the decrease in impedance in the series arm 23, as frequency increases, due to capacitance Cap3 of FET switch S3. Thus, capacitance $C_{comp}$ compensates for the upward slope in the frequency response that capacitance Cap3 and parasitic inductance L2 would cause in the absence of capacitance $C_{comp}$. The value of the capacitance $C_{comp}$ is dependent upon the gate width of the gate G5 used to form FET switch S5. The gate width of gate G5 of FET switch S5 is selected, based on the value of parasitic inductance L2 and parasitic capacitance Cap3, to compensate for the increase in the impedance of the shunt arm 25 and the decrease in the impedance of the series arm 23, as frequency of the electrical signal applied to the monolithic step attenuator 20 increases. The resulting frequency response is flat, or constant, over the defined frequency range of interest.

FIG. 3 shows the frequency response of the monolithic step attenuator 20 having internal frequency compensation. The frequency response 9 of the monolithic step attenuator is flat to within 0.3 dB for frequencies less than 7 GHz. In comparison, the frequency response 7 of the prior art solid state step attenuator 10 has a frequency slope in excess of 1.7 dB in the same frequency range.

Figure 4A:
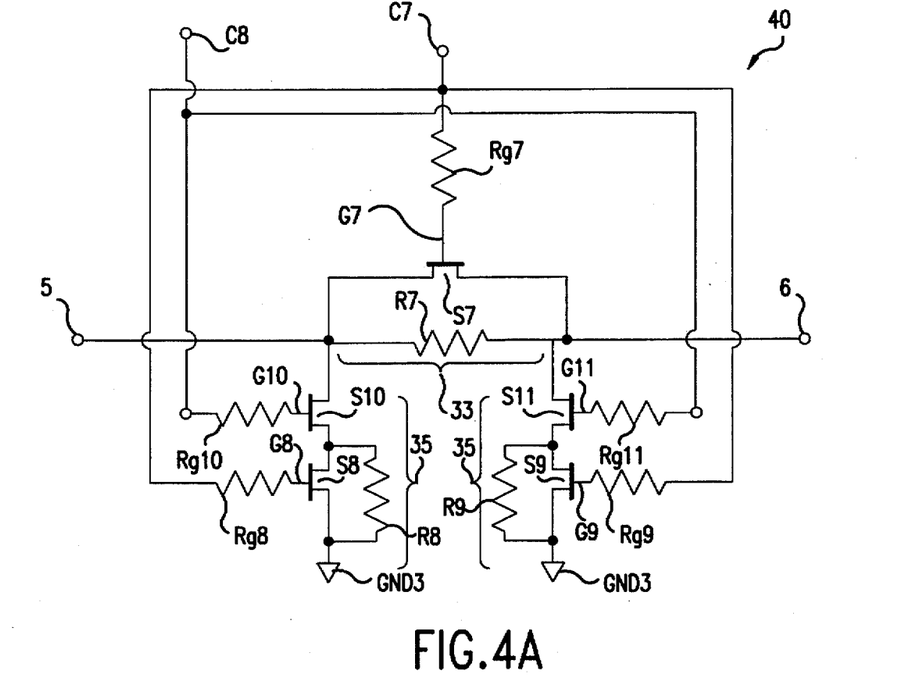
FIGS. 4A, 4B, and 4C show a monolithic step attenuator that is constructed in accordance with a second embodiment of the present invention.

FIG. 4A shows a monolithic step attenuator 40 having internal frequency compensation, that is constructed in accordance with a second embodiment of the present invention. The internal frequency compensation is provided by a FET switch S8 and FET switch S9 which produce a flat frequency response over a defined frequency range. The monolithic step attenuator 40, fabricated as a GaAs IC, includes a Pi resistor network including series resistor R7 forming a series arm 33 and shunt resistors R8 and R9 forming shunt arms 35 of the Pi resistor network. FET switch S7 is connected across series resistor R7 between an input 5 and an output 6, while FET switches S10 and S11 are connected in series with shunt resistors R8 and R9, respectively. FET switches S8 and S9 are connected in shunt, across shunt resistors R8 and R9, respectively. FET switches S7, S8 and S9 are controlled by control line C7 that supplies a voltage to gates G7, G8 and G9, respectively, through gate resistors Rg7, Rg8 and Rg9, respectively. FET switches S10 and S11 are controlled by control line C8, which supplies a voltage to gates G10 and G11 through gate resistors Rg10 and Rg11, respectively.

Figure 4B:
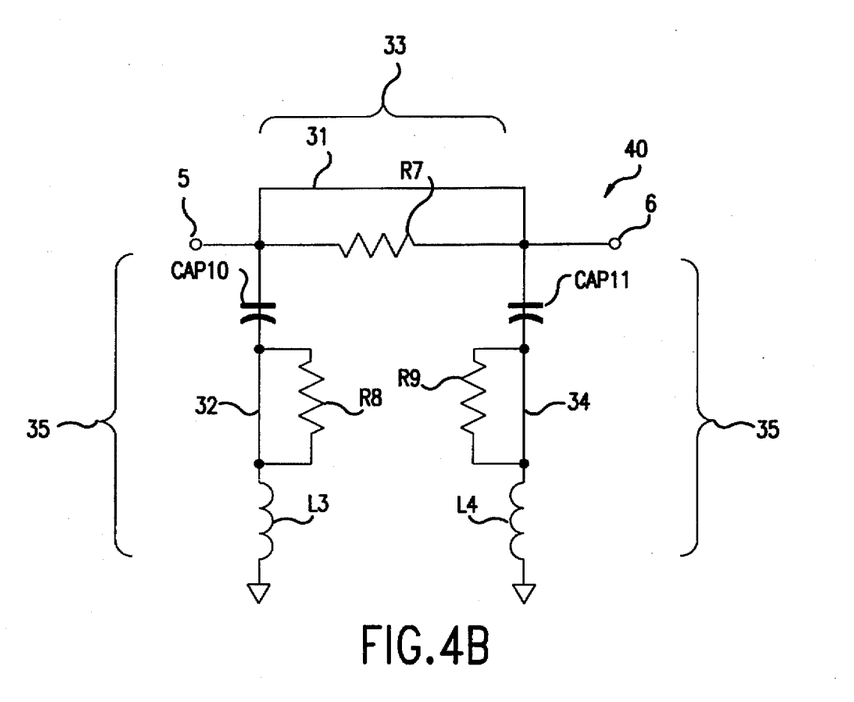

FIG. 4B shows the equivalent circuit for the monolithic step attenuator 40 in its low attenuation state. When a positive voltage is applied to control line C7, FET switch S7 closes and there is a low resistance between the drain and source of the FET switch S7, modeled by a short circuit 31 between the input 5 and output 6 of the monolithic step attenuator 40. FET switches S8 and S9 are also closed by the positive voltage applied to control line C7, providing low impedances between the drain and source of FET switches S8 and S9. These low impedances are also modeled as short circuits 32 and 34, shunted across shunt resistors R8 and R9, respectively. When a negative voltage is applied to control line C8, FET switches S10 and S11 open and there is a high impedance between the drain and source of the FET switches S10 and S11, modeled by capacitances Cap10 and Cap11, respectively. Thus, with control line C7 positive and control line C8 negative, there is a low impedance in the series arm 33 of the Pi resistor network and high impedances in the shunt arms 35, providing minimum attenuation to electrical signals between the input 5 and output 6. The effect of FET switches S8 and S9 in the low attenuation state is minimized because the impedance in each shunt arm 35 of the Pi resistor network is dominated by the high impedance provided by capacitances Cap10 and Cap11.

Figure 4C:
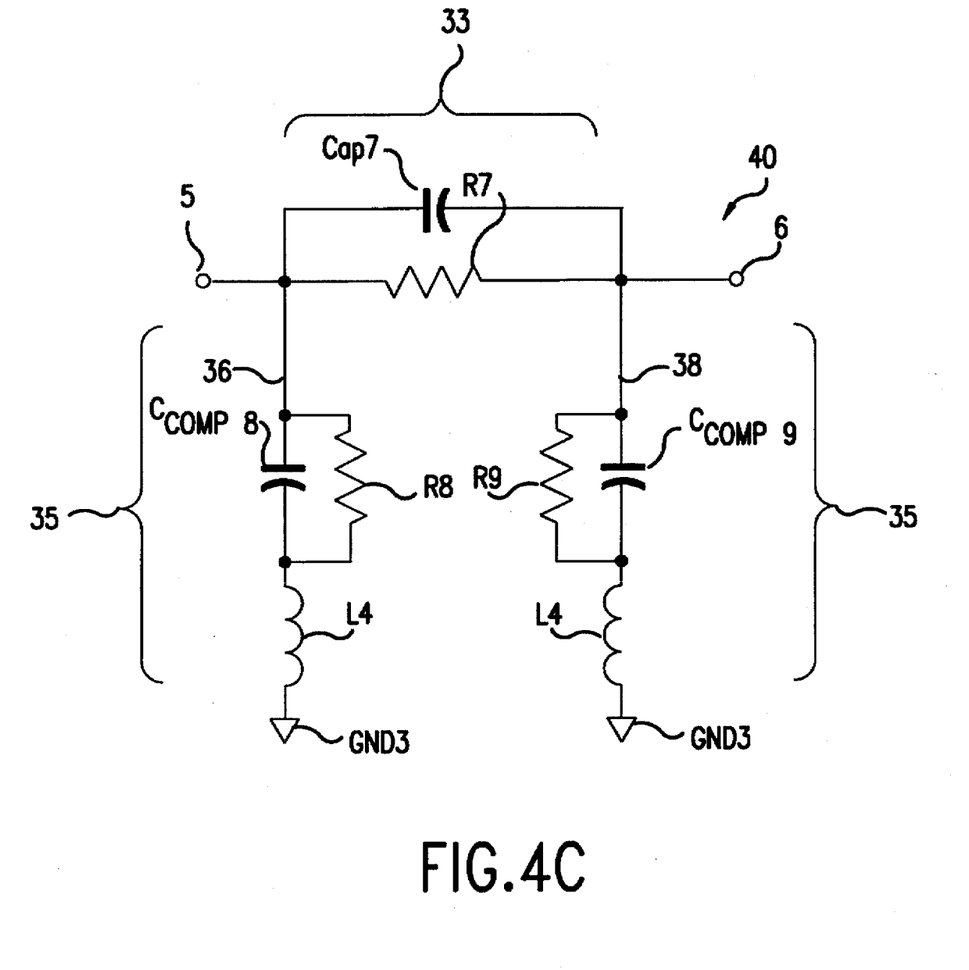

FIG. 4C shows the equivalent circuit for the monolithic step attenuator 40 in its high attenuation state. When a positive voltage is applied to control line C8, FET switches S10 and S11 close and there is a low impedance between the drain and source of FET switches S10 and S11, modeled by short circuits 36 and 38 between the series resistor R7 and the shunt resistors R8 and R9, respectively. When a negative voltage is applied to control line C7, FET switch S7 opens and there is a high impedance between the drain and source of the FET switch S7 that is modeled by a capacitor Cap7 between the input 5 and output 6. The negative voltage applied to control line C7 also causes FET switches S8 and S9 to open. This provides a high impedance between the drain and source of FET switches S8 and S9, modeled by capacitance $C_{comp8}$ and $C_{comp9}$, respectively, connected in shunt, across shunt resistors R8 and R9, respectively. Thus, with control line C7 negative and control line C8 positive, there is attenuation to electrical signals between the input 5 and output 6.

The capacitances $C_{comp8}$ and $C_{comp9}$ may be chosen to produce a constant frequency response for the monolithic step attenuator 40 in this high attenuation state. The capacitances $C_{comp8}$ and $C_{comp9}$ lower the impedance of the shunt arms 35 of the Pi resistor network as the frequency of the electrical signal applied to the monolithic step attenuator 40 increases. This counteracts the increase in the impedance in the shunt arms 35 due to a parasitic inductances L3 and L4 inherent in the conductive paths between each shunt resistor R8 and R9, and a ground plane GND3 of the GaAs IC. The capacitances $C_{comp8}$ and $C_{comp9}$ also counteract the decrease in impedance in the series arm 33, as frequency increases, due to capacitance Cap7 of FET switch S7. Thus, capacitances $C_{comp8}$ and $C_{comp9}$ compensate for the upward slope in the frequency response that capacitance Cap7 and parasitic inductances L3 and L4 would cause in the absence of capacitances $_{comp8}$ and $C_{comp9}$. The value of the capacitances $C_{comp8}$ and $C_{comp9}$ are dependent upon the gate width of the gates G8 and G9, used to form FET switches S8 and S9, respectively. The gate width of each gate G8 and G9 are selected, based on the value of parasitic inductances L3 and L4 and parasitic capacitance Cap7, to compensate for the increase in the impedance of each shunt arm 35 and the decrease in the impedance of the series arm 33, as frequency of the electrical signal applied to the monolithic step attenuator 40 increases. The resulting frequency response is flat, or constant, over the defined frequency range of interest.

Figure 5:
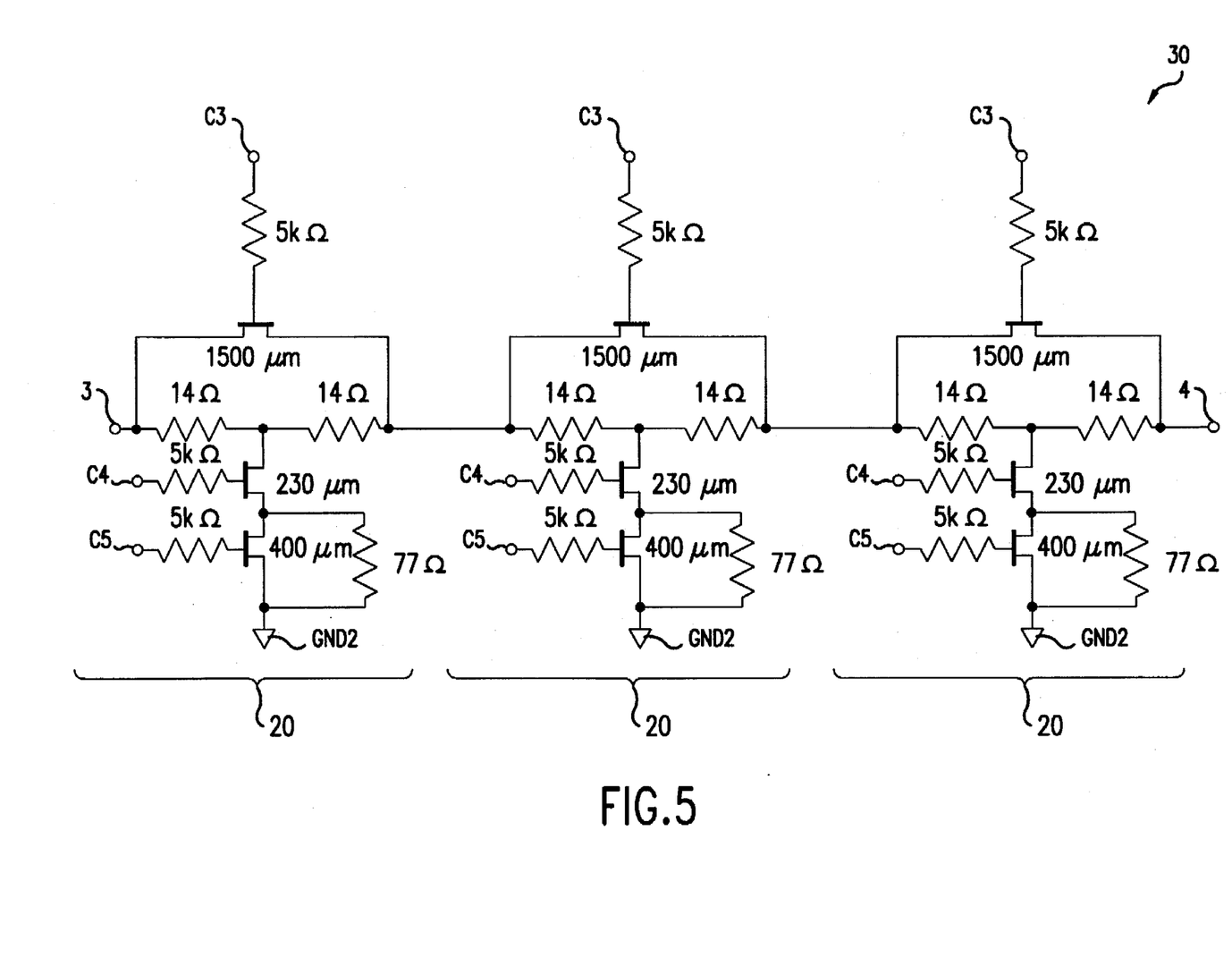
FIG. 5 shows a multicell step attenuator that is constructed in accordance with a third embodiment of the present invention.

FIG. 5 shows a multicell attenuator 30 that is constructed in accordance with a third preferred embodiment of the present invention. The multicell attenuator 30 includes three of the monolithic step attenuators 20, each having internal frequency compensation, coupled in series. The three monolithic step attenuators 20 are fabricated as a single GaAs IC and provide multiple attenuation states to control the amplitude of applied electrical signals in multiple attenuation steps. Each monolithic step attenuator 20 has a 5 dB step attenuation value, providing a choice of attenuation steps of 0 dB, 5 dB, 10 dB and 15 dB between the input 3 and the output 4 of the multicell attenuator 30, depending on the voltages applied to control lines C3, C4 and C5. The control signal lines C3, C4 and C5 of the various monolithic step attenuators 20 may be coupled to reduce the number of control signal connections to the GaAs IC. Although the monolithic step attenuators 20 using Tee resistor networks are shown, the multicell step attenuator 30 may also be constructed by coupling monolithic step attenuators 40 having Pi resistor networks.

In each embodiment of the present invention, a fixed capacitor of the appropriate value may be incorporated in the monolithic step attenuators 20, 40 to provide frequency compensation. However, due to tolerances in dielectric constants and dielectric thickness in GaAs IC fabrication, the exact value of a capacitor may be difficult to control. Variations in the values of fixed capacitors reduce chip yields and increase the cost of the GaAs ICs. In the present invention internal frequency compensation is provided by the drain-to-source capacitance of a FET switch, precisely controlled by tailoring the gate width of the gate of the FET switch. Fabrication of monolithic step attenuators 20, 40 using the drain-to-source capacitance of a FET switch simplifies the GaAs IC fabrication processes, improves chip yields and reduces the manufacturing cost of monolithic step attenuators.

In the present invention, monolithic step attenuators having internal frequency compensation reduce the cost and complexity of microwave systems. The monolithic step attenuators, having internal frequency compensation, may be formed using Tee or Pi resistor networks. The monolithic step attenuators may also be coupled in series to form multicell step attenuators which have multiple attenuation states.

What is claimed is:

1. A monolithic step attenuator having an input and an output and a ground and a defined frequency range, the monolithic step attenuator controlling the amplitude of an electrical signal applied to the input according to a first attenuation state and a second attenuation state within the defined frequency range, the monolithic step attenuator comprising:

a pair of resistors coupled in series between the input and the output;

a first electronic switch coupled between the input and the output in parallel with the pair of resistors;

a second electronic switch having a first terminal and a second terminal, the first terminal coupled to the pair of resistors;

a third resistor coupled between the second terminal of the second electronic switch and a conductive path to the ground, the conductive path having a parasitic inductance;

a FET switch having a conducting state and a nonconducting state and having a drain-to-source capacitance, coupled in shunt with the third resistor; and wherein the second attenuation state is enabled when the first electronic switch is closed and the second electronic switch is open, and wherein the first attenuation state is enabled when the first electronic switch is open and the second electronic switch is closed and the FET switch is in the nonconducting state.

2. The monolithic step attenuator of claim 1 wherein the drain-to-source capacitance is adjusted by the gate length of the FET switch.

3. The monolithic step attenuator of claim 2 wherein the gate width is adjusted to provide constant attenuation to the electrical signal applied to the input when the first attenuation state is enabled.

4. A monolithic step attenuator with an input, an output and a ground and a defined frequency range, the monolithic step attenuator controlling the amplitude of an electrical signal within the frequency range according to a first attenuation state and a second attenuation state, the monolithic step attenuator comprising:

a series impedance including,
a first resistor and a second resistor coupled in series between the input and the output, and
a first switch coupled between the input and the output in parallel with the first resistor and the second resistor;

a shunt impedance, including a second switch and a third resistor coupled in series, the shunt impedance coupled between the first resistor and the second resistor and to a conductive path to the ground, wherein the first attenuation state is enabled by opening the first switch and closing the second switch; and a capacitance connected in parallel with the third resistor, reducing current through the third resistor in proportion to the frequency of the applied electrical signal when the first attenuation state is enabled.

5. The monolithic step attenuator of claim 4 wherein the second attenuation state is enabled when the first switch is closed and the second switch is open.

6. The monolithic step attenuator of claim 5 wherein the capacitance is provided by a drain-to-source capacitance of a FET switch.

7. The monolithic step attenuator of claim 6 wherein the FET switch is open when the first attenuation state is enabled.

8. The monolithic step attenuator of claim 7 wherein the drain-to-source capacitance is controlled by a gate width of the FET switch.

9. The monolithic step attenuator of claim 8 wherein the first switch further comprises a parasitic capacitance, and the gate width of the field effect transistor is chosen according to a parasitic inductance of the conductive path and the parasitic capacitance.

10. The monolithic step attenuator of claim 8 wherein a plurality of identical monolithic step attenuators are coupled in series to form a multicell step attenuator.

11. A monolithic step attenuator having a defined frequency range, an input and an output and a ground, the monolithic step attenuator controlling the amplitude of an electrical signal within the defined frequency range, according to a first attenuation state and a second attenuation state, the monolithic step attenuator comprising:

a series resistor coupled between the input and the output;

a series switch coupled between the input and the output in parallel with the series resistor;

a first shunt switch having a first terminal and a second terminal, the first terminal coupled to the input;

a first shunt resistor coupled between the second terminal of the first shunt switch and a first conductive path to the ground, the first conductive path having a first parasitic inductance;

a second shunt switch having a first terminal and a second terminal, the first terminal coupled to the output;

a second shunt resistor coupled between the second terminal of the second shunt switch and a second conductive path to the ground, the second conductive path having a second parasitic inductance;

a first FET switch having a conducting state and a nonconducting state and having a drain-to-source capacitance, coupled in shunt with the first shunt resistor;

a second FET switch having a conducting state and a nonconducting state and having a drain-to-source capacitance, coupled in shunt with the second shunt resistor; and wherein the second attenuation state is enabled when the series switch is closed and the first and second shunt switches are open, and wherein the first attenuation state is enabled when the series switch is open and the first and second shunt switches are closed and the first and second FET switches are open.

12. The monolithic step attenuator of claim 11 wherein the drain-to-source- capacitance of the first FET switch is adjusted by the gate width of the first FET switch and wherein the drain-to-source capacitance of the second FET switch is adjusted by the gate width of the second FET switch.

13. The monolithic step attenuator of claim 12 wherein the gate width of the first FET switch and the gate width of the second FET switch are adjusted to provide constant attenuation to the electrical signal applied to the input when the first attenuation state is enabled.

* * * * *